United States Patent
Cai et al.

(10) Patent No.: US 10,454,397 B2
(45) Date of Patent: Oct. 22, 2019

(54) MAGNETIC SENSOR INTEGRATED CIRCUIT, MOTOR ASSEMBLY AND APPLICATION APPARATUS

(71) Applicant: Johnson Electric S.A., Murten (CH)

(72) Inventors: Guang Jie Cai, Hong Kong (CN); Chun Fai Wong, Hong Kong (CN)

(73) Assignee: JOHNSON ELECTRIC INTERNATIONAL AG, Murten (CH)

( * ) Notice: Subject to any disclaimer, the term of this patent is extended or adjusted under 35 U.S.C. 154(b) by 60 days.

(21) Appl. No.: 15/581,832

(22) Filed: Apr. 28, 2017

(65) Prior Publication Data

US 2017/0317621 A1    Nov. 2, 2017

(30) Foreign Application Priority Data

Apr. 29, 2016 (CN) .......................... 2016 1 0289862
Jun. 3, 2016 (CN) .......................... 2016 1 0396836

(51) Int. Cl.
| | |
|---|---|
| H02P 6/16 | (2016.01) |
| G01R 33/00 | (2006.01) |
| H02K 11/215 | (2016.01) |
| H02P 6/26 | (2016.01) |

(52) U.S. Cl.
CPC ............ *H02P 6/16* (2013.01); *G01R 33/0029* (2013.01); *G01R 33/0041* (2013.01); *H02K 11/215* (2016.01); *H02P 6/26* (2016.02)

(58) Field of Classification Search
USPC .................................... 318/400.38, 647, 653
See application file for complete search history.

(56) References Cited

U.S. PATENT DOCUMENTS

| | | | |
|---|---|---|---|
| 2008/0094055 A1* | 4/2008 | Monreal | G01D 3/02 324/117 H |
| 2010/0090633 A1* | 4/2010 | Deller | H02K 29/08 318/400.39 |
| 2011/0018533 A1* | 1/2011 | Cesaretti | G01R 33/0035 324/251 |
| 2012/0025817 A1* | 2/2012 | Romero | G01R 33/07 324/251 |
| 2012/0239350 A1* | 9/2012 | Motz | G01R 33/0029 702/190 |
| 2015/0176963 A1* | 6/2015 | Diaconu | G01R 33/077 702/95 |
| 2015/0222192 A1* | 8/2015 | Freeman | H02M 1/08 363/21.09 |
| 2017/0030979 A1* | 2/2017 | Cesaretti | G01R 33/0035 |

* cited by examiner

*Primary Examiner* — Jorge L Carrasquillo
(74) *Attorney, Agent, or Firm* — Muncy, Geissler, Olds & Lowe, P.C.

(57) ABSTRACT

A magnetic sensor integrated circuit, a motor and an application apparatus are provided. The magnetic sensor integrated circuit includes an input port, a magnetic sensor, and a signal processing unit. The input port is electrically coupled to an external power source. The magnetic sensor senses a polarity of an external magnetic field and outputting a detection signal. The signal processing unit includes a switched capacitor filter unit to sample and filter the detection signal; the signal processing unit eliminating an offset of the detection signal.

14 Claims, 13 Drawing Sheets

MAGNETIC SENSOR INTEGRATED CIRCUIT, MOTOR ASSEMBLY AND APPLICATION APPARATUS

CROSS REFERENCE TO RELATED APPLICATIONS

This non-provisional patent application claims priority under 35 U.S.C. § 119(a) from Patent Application No. 201610289862.X filed in the People's Republic of China on Apr. 29, 2016 and 201610396836.7 filed in the People's Republic of China on Jun. 3, 2016.

FIELD

The present disclosure relates to magnetic field detection, more particularly, to a magnetic sensor integrated circuit, a motor assembly and an application apparatus.

BACKGROUND

Magnetic sensors are widely applied in modern industries and electronic products to induce a magnetic field strength for measuring physical parameters such as current, position and direction. The motor is an important application field of magnetic sensor. The magnetic sensor may serve as a rotor magnetic-pole position sensor in the motor.

In general, the magnetic sensor can only output a magnetic field detection signal. However, the magnetic field detection signal is weak and mixed with offset of the magnetic sensor; it's difficult to obtain an accurate magnetic field detection signal.

SUMMARY

In an aspect of the present disclosure, a magnetic sensor integrated circuit is provided, which includes: an input port electrically coupled to an external power source; a magnetic sensor sensing a polarity of an external magnetic field and outputting a detection signal; and a signal processing unit having a switched capacitor filter unit to sample and filter the detection signal and eliminate an offset of the detection signal.

BRIEF DESCRIPTION OF THE DRAWINGS

To illustrate technical solutions according to embodiments of the disclosure or in the conventional technology more clearly, the following briefly describes the drawings according to embodiments of the disclosure. Apparently, the drawings are only some embodiments of the present disclosure, and other drawings may be obtained by those skilled in the art according to those drawings without creative efforts.

DETAILED DESCRIPTION OF EMBODIMENTS

The technical solutions of embodiments of the disclosure will be illustrated clearly and completely in conjunction with the drawings of the embodiments of the disclosure. Apparently, the described embodiments are only a few embodiments rather than all embodiments of the disclosure. Any other embodiments obtained by those skilled in the art on the basis of the embodiments of the present disclosure without creative work will fall within the scope of the present disclosure.

As described in the Background section, in the conventional technologies, generally, a magnetic sensor integrated circuit can only output a magnetic field detection result, and an additional peripheral circuit is required to process the magnetic detection result. Therefore, the whole circuit has a high cost and a poor reliability.

In view of this, a magnetic sensor integrated circuit, a motor assembly and an application apparatus are provided according to embodiments of the disclosure, to reduce cost of the whole circuit and improve reliability of the whole circuit by expanding functions of a conventional magnetic sensor integrated circuit. In order to achieve the above object, the technical solutions according to the embodiments of the present disclosure are described in detail in conjunction with FIG. 1 to FIG. 11.

Figure 1:
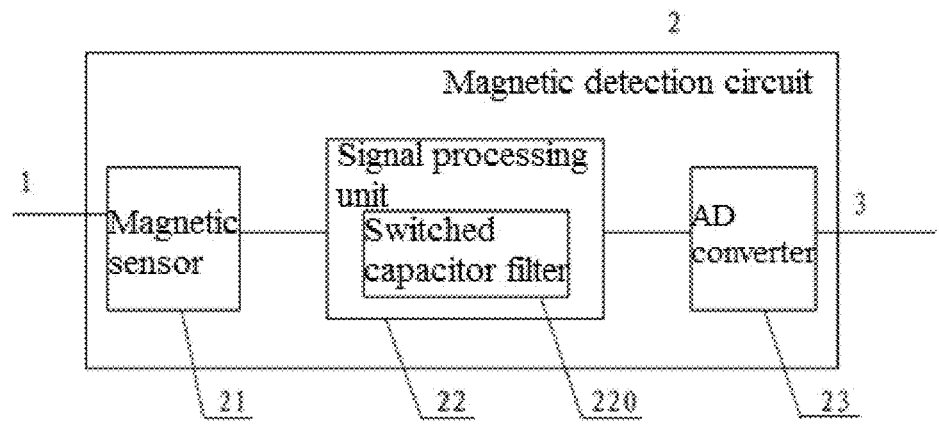
FIG. 1 is a block diagram of a magnetic sensor according to one embodiment.

FIG. 1 shows a block diagram of a magnetic sensor 10 according to one embodiment. The magnetic sensor 10 can include an input port 1, a magnetic detection circuit 2, and an output port 3. The input port 1 is electrically coupled to an external power source. In the embodiment, the external power source is an AC power source.

The magnetic detection circuit 2 includes a magnetic sensor 21, a signal processing unit 22, and an analog-to-digital (AD) converter 23. The magnetic sensor 22 can sense a polarity of an external magnetic field and output a detection signal. The signal processing unit 22 can amplify the detection signal and eliminate an offset of the detection signal. The signal processing unit 22 can comprise a switched capacitor filter 220 to sample and filter the detection signal and then eliminate an offset of the detection signal. The AD converter 23 converts the detection signal processed by the signal processing unit 22 into a magnetic detection signal. The magnetic detection signal is output by the output port 3. In the embodiment, the magnetic detection signal is a switching digital signal.

The detection signal includes a magnetic field signal and an offset signal. The magnetic field signal indicates an actual magnetic voltage signal associated with the external magnetic field that is sensed by magnetic sensor 21. The offset signal is a bias signal inherited in magnetic sensor 21.

Figure 2:
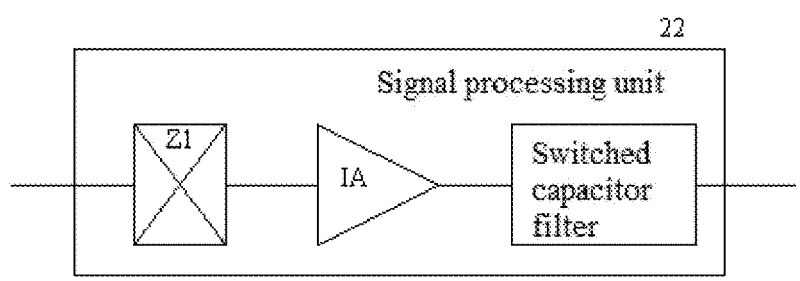
FIG. 2 is a block diagram of a signal processing unit according to one embodiment.

FIG. 2 shows a block diagram of a signal processing unit 22 according to one embodiment. The signal processing unit 22 can include a first chopping switch Z1 coupled with the magnetic sensor 21. The first chopping switch Z1 modulates the magnetic field signal and the offset signal to a chopping frequency and a baseband frequency.

The signal processing unit 22 can further include a chopping amplifier IA, which amplifies the magnetic field signal and the offset signal output by the first chopping switch Z1 and demodulates the magnetic field signal to the baseband frequency. The chopping amplifier IA may comprise at least one folded cascode amplifier. In the embodiment, the chopping frequency has a frequency ranging from 100 KHz to 600 KHz inclusively, and preferably may have a frequency of 400 KHz. The baseband frequency is greater than 100 KHz, and the baseband frequency is less than 200 Hz.

In the embodiment, each of the inputs and outputs of first chopping switch Z1 and chopping amplifier IA are illustrated in a single line. It should be appreciated that FIG. 2 is for illustrative purpose. The present teaching is not intended to be limiting. Each of the inputs and outputs of first chopping switch Z1, chopping amplifier IA may be one or more input/output signals. In some embodiments, each of the inputs and outputs of first chopper switch Z1 and chopping amplifier IA include one or more pairs of differential signals.

Figure 3A:
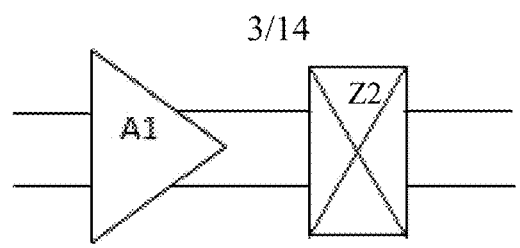
FIG. 3*a* is a block diagram of a chopping amplifier according to one embodiment.

FIG. 3A shows a block diagram of a chopping amplifier according to one embodiment. The chopping amplifier IA can include a first amplifier A1 and a second chopping switch Z2, which are connected in series. The first amplifier A1 is configured to perform a first stage amplification of the offset signal and the magnetic field signal from first chopper switch Z1. In some embodiments, first amplifier A1 is implemented using the at least one folded cascode amplifier. The second chopping switch Z1 is configured to demodulate the amplified deviation signal and the magnetic field signal to the chopper frequency and the baseband frequency for transmission, respectively.

Figure 3B:
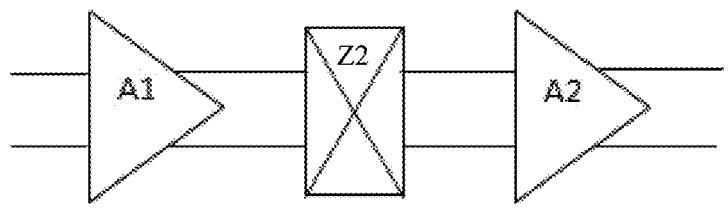
FIG. 3*b* is a block diagram of a chopping amplifier according to another embodiment.

FIG. 3B shows a block diagram of a chopping amplifier according to another embodiment. According to the illustrated embodiment, the chopping amplifier IA in FIG. 3B may comprise a second amplifier A2 in addition to first amplifier A1 and second chopping switch Z2. The second amplifier A2 is configured to further perform a second stage amplification of the offset signal and the magnetic field signal from the second chopping switch Z2. In some embodiments, second chopping switch Z2 is implemented based on a single-stage amplifier.

Figure 4:
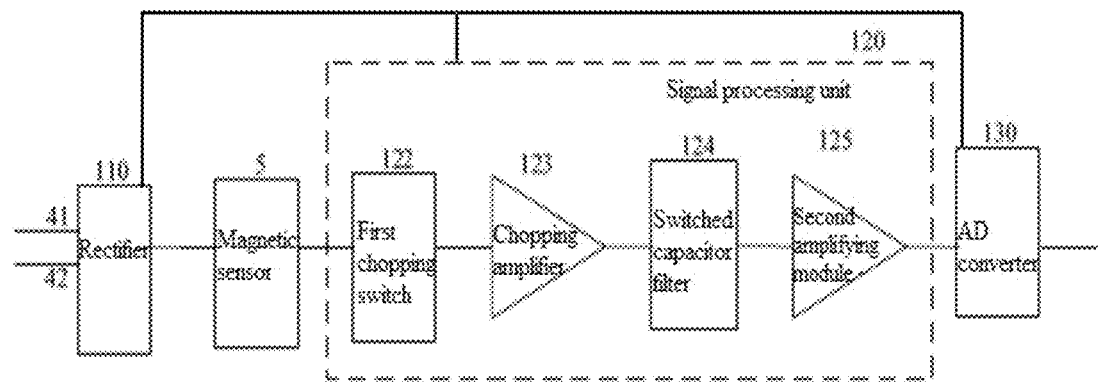
FIG. 4 is a block diagram of a magnetic sensor integrated circuit according to one embodiment.

FIG. 4 shows a block diagram of a magnetic sensor integrated circuit according to one embodiment. The magnetic sensor integrated circuit comprises an input port, a magnetic sensor 5, a rectifier circuit 110, a signal processing unit 120, and an analog-to-digital converter 130. Input port in this embodiment comprises a pair of input ports 41 and 42 that connect to the external power source. In some embodiments, input port may connect to the external power source serial. In yet other embodiments, input port may connect to the external power supply in parallel.

Rectifier circuit 110 may be implemented based on a full wave rectifier bridge and a voltage regulator (not shown). A full wave rectifier bridge may be configured to convert an AC signal from the AC power supply into a DC signal. A voltage regulator may be configured to regulate the DC signal within a pre-set range. Rectifier circuit 110 supplies the regulated DC signal to the magnetic sensor 5, the signal processing unit 120, and the analog-to-digital converter 130.

The magnetic sensor 5 can receive a constant current not affected by temperature change to sense a polarity of an external magnetic field and output a detection signal. The signal processing unit 120 comprises a first chopping switch 122, a chopping switch 123, a switched capacitor filter unit 124, and a second amplifying module 125. The first chopping switch 122 is electrically coupled to the magnetic sensor 5. The second amplifying module 125 is electrically coupled to the analog-to-digital converter 130.

Figure 5:
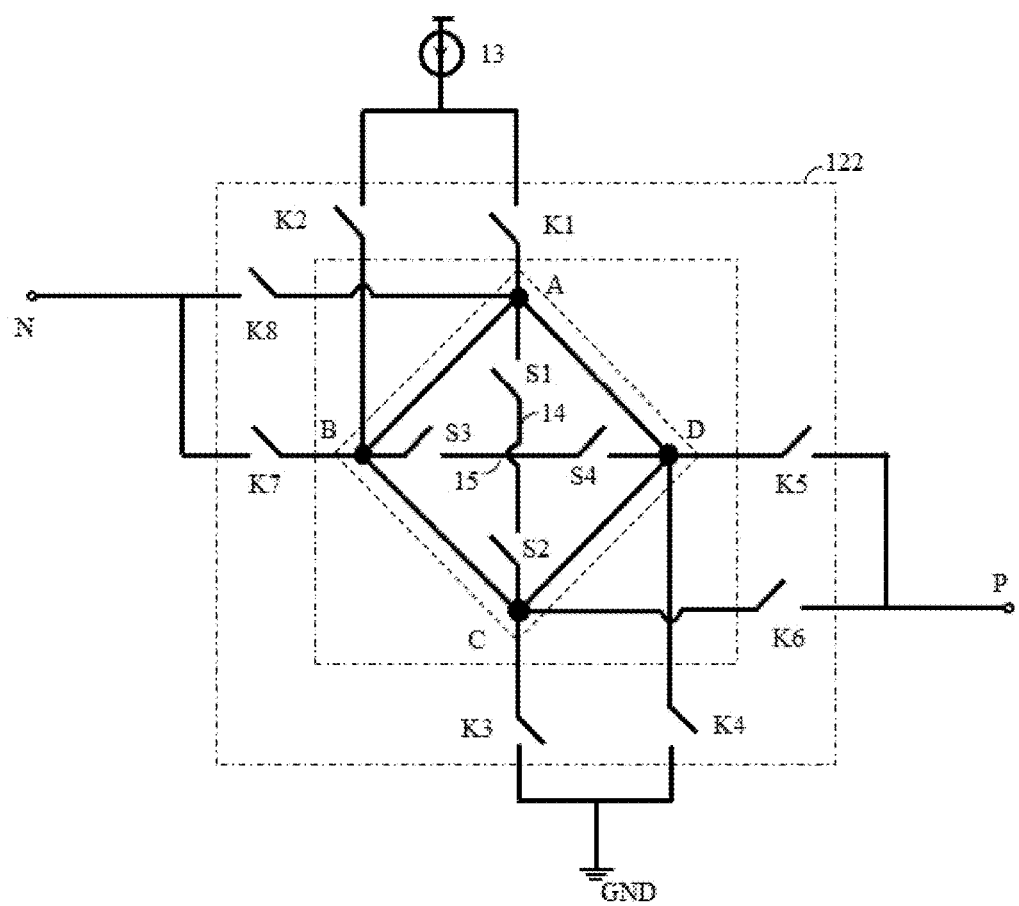
FIG. 5 is a structural diagram of a magnetic sensor and a first chopping switch according to one embodiment.
Figure 6A:
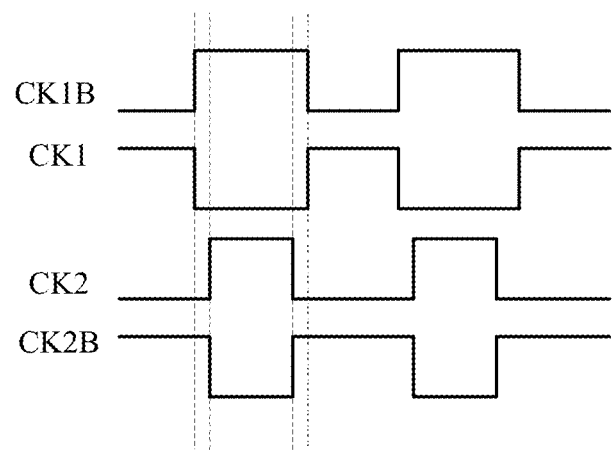
FIG. 6*a* is a time-sequence diagram of four sub clock signals of the magnetic sensor and the first chopping switch of FIG. 5.
Figure 6B:
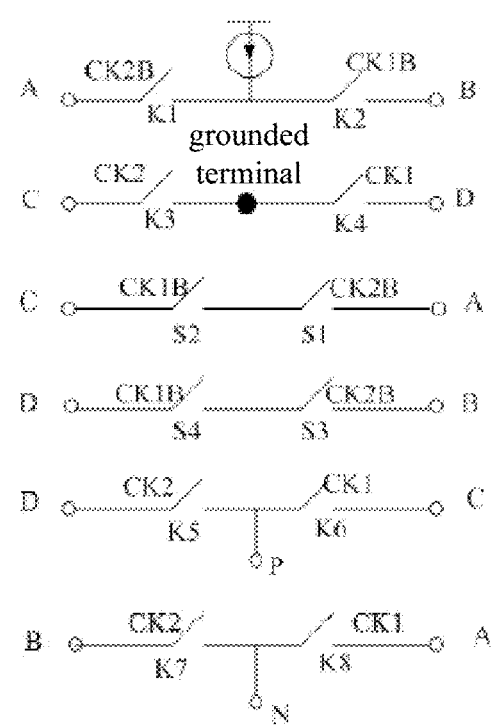
FIG. 6*b* is a schematic diagram of control signals of a discharging switch and a first chopping switch of FIG. 5.

FIG. 5 shows a block diagram of a magnetic sensor and a first chopping switch according to one embodiment. FIG. 6a shows a time-sequence diagram of four sub clock signals of the magnetic sensor and the first chopping switch of FIG. 5. FIG. 6b shows a schematic diagram of control signals of a discharging switch and a first chopping switch of FIG. 5.

The magnetic sensor 5 includes four contact terminals. The magnetic sensor 5 includes a first terminal A and a third terminal C which are arranged oppositely, and a second terminal B and a fourth terminal D which are arranged oppositely. In the embodiment of the present disclosure, the magnetic sensor 5 is a Hall plate. The magnetic sensor 200 is driven by a first power source 13 which may be provided by the rectifier circuit 110. In the embodiment, the first power source 13 is a constant current source not affected by temperature change.

The first chopping switch 122 includes eight switches: K1 to K8 as shown in FIG. 5, which are electrically connected to the four terminals. Specifically, the first chopping switch 122 includes a first switch K1, a second switch K2, a third switch K3, a fourth switch K4, a fifth switch K5, a sixth switch K6, a seventh switch K7 and an eighth switch K8. The first switch K1 is electrically connected between the first power source 13 and the first terminal A. The second switch K2 is electrically connected between the first power source 13 and the second terminal B. The third switch K3 is electrically connected between a grounded end GND and the third terminal C. The fourth switch K4 is electrically connected between the grounded end GND and the fourth terminal D. The fifth switch K5 is electrically connected between a first output end P and the fourth terminal D. The sixth switch K6 is electrically connected between the first output end P and the third terminal C. The seventh switch K7 is electrically connected between a second output end N and the second terminal B. The eighth switch K8 is electrically connected between the second output end N and the first terminal A.

The first clock signal includes a first sub clock signal CK2B, a second sub clock signal CK1B, a third clock signal CK2 and a fourth sub clock signal CK1. The first switch K1 and the second switch K2 are respectively controlled by the first sub clock signal CK2B and the second sub clock signal CK1B. The third switch K3 and the fourth switch K4 are respectively controlled by the third sub clock signal CK2 and the fourth sub clock signal CK1. The fifth switch K5 and the sixth switch K6 are respectively controlled by the third sub clock signal CK2 and the fourth sub clock signal CK1. The seventh switch K7 and the eighth switch K8 are respectively controlled by the third sub clock signal CK2 and the fourth sub clock signal CK1.

In order to ensure an accuracy of an output signal, the first clock signal includes at least two non-overlapping sub clock signals. A phase of the first sub clock signal CK2B is opposite to a phase of the third sub clock signal CK2, and a phase of the second sub clock signal CK1B is opposite to a phase of the fourth sub clock signal CK1. The third sub clock signal CK2 and the fourth sub clock signal CK1 are non-overlapping sub clock signals.

When the first terminal A is electrically connected to the first power source 13 and the third terminal C is electrically connected to the grounded end GND, the second terminal B is electrically connected to the second output end N and the fourth terminal D is electrically connected to the first output end P. When the second terminal B is electrically connected to the first power source 13 and the fourth terminal D is electrically connected to the grounded end GND, the first terminal A is electrically connected to the second output end N and the third terminal C is electrically connected to the first output end P. The first output end P outputs a differential signal P1, and the second output end N outputs a differential signal N1.

Besides the magnetic sensor 5 and the first chopping switch 122 described, the magnetic sensor 5 further includes a first discharging branch 14 electrically connected between the first terminal A and the third terminal C, i.e. a branch between the first terminal A and the third terminal C, and a second discharging branch 15 electrically connected between the second terminal B and the fourth terminal D, i.e. a branch between the second terminal B and the fourth terminal D. Before the first terminal A and the third terminal C serve as power input ends and the second terminal B and the fourth terminal D serve as magnetic sensed signal output ends, the second discharging branch 15 is turned on. Before the first terminal A and the third terminal C serve as magnetic sensed signal output ends and the second terminal B and the fourth terminal D serve as power input ends, the first discharging branch 14 is turned on.

In a possible implementation, the first discharging branch 14 may include a first discharging switch S1 and a second discharging switch S2 which are electrically connected in series. The first discharging switch S1 and the second discharging switch S2 are respectively controlled by the first sub clock signal CK2B and the second sub clock signal CK1B. The second discharging branch 15 includes a third discharging switch S3 and a fourth discharging switch S4 which are electrically connected in series. The third discharging switch S3 and the fourth discharging switch S4 are respectively controlled by the first sub clock signal CK2B and the second sub clock signal CK1B.

When the first terminal A and the third terminal C serve as power input ends and the second terminal B and the fourth terminal D serve as output ends of the magnetic field signal, during a period that the first sub clock signal CK2B overlaps with the second sub clock signal CK1B, the first discharging switch S1 and the second discharging switch S2 are simultaneously turned on. When the first terminal A and the third terminal C serve as output ends of the magnetic field signal and the second terminal B and the fourth terminal D serve as power input ends, during a period that the first sub clock signal CK2B overlaps with the second sub clock signal CK1B, the third discharging switch S3 and the fourth discharging switch S4 are simultaneously turned on.

As shown in FIG. 6a, the four sub clock signals includes two non-overlapping control signals, i.e. the third sub clock signal CK1 and the fourth sub clock signal CK2, and two overlapping control signals, i.e. the second sub clock signal CK1B and the first sub clock signal CK2B. CK1 is opposite to CK1B and CK2 is opposite to CK2B. The overlapping sub clock signals CK1B and CK2B are both at a high level during the period in which CK1B overlaps with CK2B, i.e., a period of time between two dotted lines as shown in FIG. 6a. The two non-overlapping sub clock signals CK1 and CK2 and the two overlapping sub clock signals CK1B and CK2B may have a frequency ranging from 100 KHz to 600 KHz inclusively, and preferably may have a frequency of 400 KHz.

In the embodiment of the present disclosure, the eight switches included in the first chopping switch 122 and the four discharging switches included in the discharging branches each may be a transistor. Furthermore, when CK1 is high level, CK2B is high level, and CK2 and CK1B are low level. In conjunction with FIG. 6b, in such case, the second terminal B and the fourth terminal D are respectively electrically connected to the first power 13 and the grounded end GND and serve as the power input ends, the switches between the third terminal C and the first output end P are turned on, the switches between the first terminal A and the second output end N are turned on, and the first terminal A and the third terminal C serve as output ends of the magnetic field signal. A short period of time just after transition of CK1 from the high level to the low level, i.e. a period of time between the first two dotted lines as shown in FIG. 5b, is an overlapping period of the two overlapping sub clock signals CK1B and CK2B. In the overlapping period, CK1B and CK2B are both high level, the third discharging switch S3 and the fourth discharging switch S4 between the second terminal B and the fourth terminal D are simultaneously turned on, and the second terminal B is short-circuited with the fourth terminal D thereby eliminating charges stored in a parasitic capacitor between the second terminal B and the fourth terminal D. After the overlapping period, when CK1 is low level, CK2B is low level, and CK2 and CK1B are high level. In this case, the first terminal A and the third terminal C are respectively electrically connected to the first power and the grounded end GND and serve as power input ends, the switches between the second terminal B and the first output end P are turned on, the switches between the fourth terminal D and the second output end N are turned on, and the second terminal B and the fourth terminal D serve as output ends of the magnetic field signal. A short period of time just before transition of CK1 from the low level to the high level, i.e. a period of time between the second two dotted lines as shown in FIG. 5b, is an overlapping period of the two sub clock signals CK1B and CK2B. In this period, CK1B and CK2B are both high level, the first discharging switch S1 and the second discharging switch S2 between the first terminal A and the third terminal C are turned on, and the terminal A is short-circuited with the third terminal C, thereby eliminating charges stored in a parasitic capacitor between the first terminal A and the third terminal C.

Figure 6C:
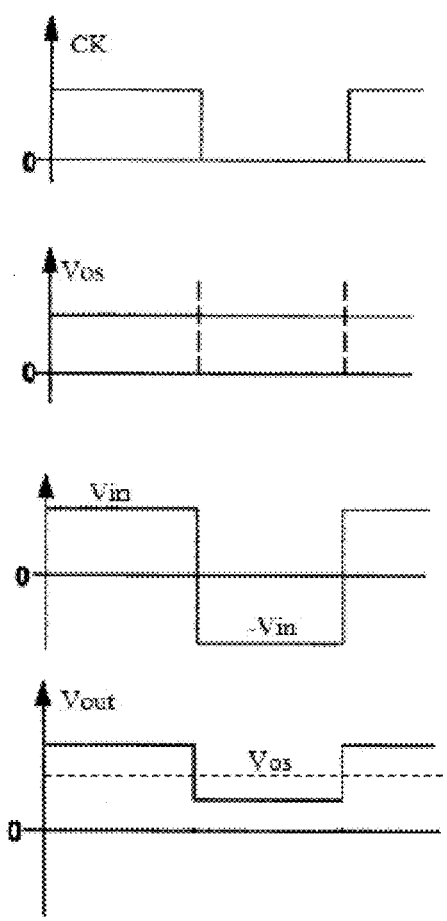
FIG. 6*c* is a schematic signal diagram of a circuit shown in FIG. 5.

FIG. 6c is a schematic diagram of signals in the circuit shown in FIG. 5. In FIG. 6c, CK is a clock signal, Vos is an offset voltage signal of the magnetic sensor 5 which may be assumed to be constant at any instant in a clock signal cycle and depends on a physical property of the Hall plate 5. Vin and −Vin are ideal magnetic field signals output by the first chopping switch in a first half cycle and a second half cycle of the clock signal CK respectively, i.e., ideal outputs of the Hall plate 5 not interfered by an offset signal. As described in the above, in the first half cycle of the clock signal CK, the terminals A and C are electrically connected to the first power and the ground respectively, and the terminals B and D are electrically connected to output ends. In the second half of the cycle of the clock signal CK, the terminals B and D are respectively electrically connected to the first power and the ground, and the terminals A and C are electrically connected to output ends. In the first and second half cycles of the clock signal CK, the ideal magnetic field signals output by the first chopping switch have the same magnitude and opposite directions. Vout is an output signal of the first chopping switch, which is a signal superposition of the offset signal Vos and the ideal magnetic field signal Vin. In this way, the magnetic field signal is modulated to the high frequency region with the first chopping switch.

In an embodiment of the present disclosure, the ideal magnetic field voltage signal output by the magnetic sensor 200 is very weak. Generally, the ideal magnetic field signal is only a few tenths millivolts, and the offset signal is close to 10 millivolts. Therefore, it is required to eliminate the offset signal and amplify the ideal magnetic field signal subsequently.

In an embodiment of the present disclosure, the chopping amplifier 123 may be a chopping amplifier as shown in FIG. 3B. That is, the chopping amplifier 123 includes a first amplifier A1, a second chopping switch Z2 and a second amplifier A2 which are sequentially electrically connected. The first amplifier A1 and the second amplifier A2 can amplify input signals. The second chopping switch Z2 can demodulate the magnetic field signal of the detection signal output by the first chopping switch 301 to the low frequency region. The first amplifier A1 may be a folded-cascode amplifier and the second amplifier A2 may be a single-stage amplifier. A gain of the chopping amplifier is 100.

In reference with the integrated circuit shown in FIG. 3B, the first amplifier A1 and the second amplifier A2 are configured to amplify input signals, the second chopping switch Z2 is configured to demodulate the magnetic field signal of the detection signal output by the first chopping switch 122 to the low frequency region under control of the first clock signal.

In the embodiment of the present disclosure, the first amplifier A1 receives a pair of differential signals P1 and N1 output by the first chopping switch 122, and output a pair of differential signals. The second chopping switch Z2 directly outputs the pair of differential signals output by the first amplifier A1 in a first half cycle of each clock cycle, and exchanges the two differential signals output by the first amplifier A1 and outputs the exchanged differential signals in a second half cycle of each clock cycle. The output signals of the second chopping switch Z2 are defined as P2 and N2.

Figure 7:
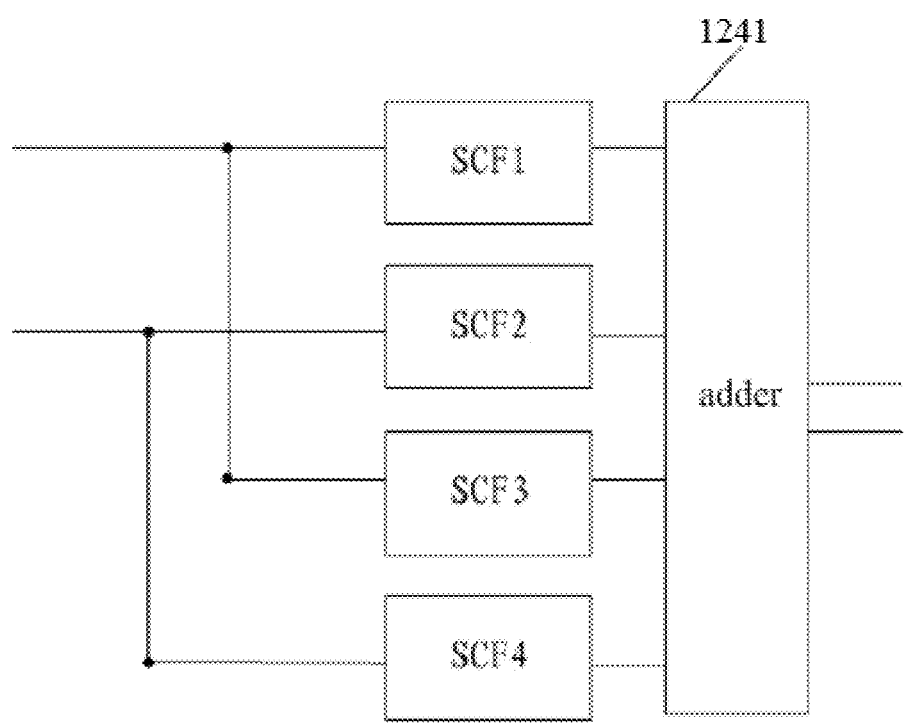
FIG. 7 is a block diagram of a switched capacitor filter unit according to one embodiment.

As shown in FIG. 7, after the previous signal processing, the switched capacitor filter unit 124 according to the embodiment of the present disclosure samples the differential signals output by the chopping amplifier 123, eliminates the offset of the sampled signal to obtain a differential signal, amplify the differential signal, and outputs the amplified differential signal. Optionally, in the embodiment of the present disclosure, a sampling frequency of the switched capacitor filter unit 124 may be the same as a chopping frequency of the first chopping switch, that is, frequencies of the first clock signal and the second clock signal are the same. The differential signal output by the chopping amplifier 123 includes a first sub differential signal and a second sub differential signal.

In an embodiment of the present disclosure, the switched capacitor filter unit may be a switched capacitor filter unit as shown in FIG. 7. The switched capacitor filter unit 124 includes a first switched capacitor filter SCF1, a second switched capacitor filter SCF2, a third switched capacitor filter SCF3 and a fourth switched capacitor filter SCF4. The first switched capacitor filter SCF1 and the second switched capacitor filter SCF2 sample the differential signal output by the chopping amplifier 123 during a first half cycle thereof as a first sampled signal. The third switched capacitor filter SCF3 and the fourth switched capacitor filter SCF4 can sample the differential signal output by the chopping amplifier 123 during a second half cycle thereof as a second sampled signal.

Figure 8A:
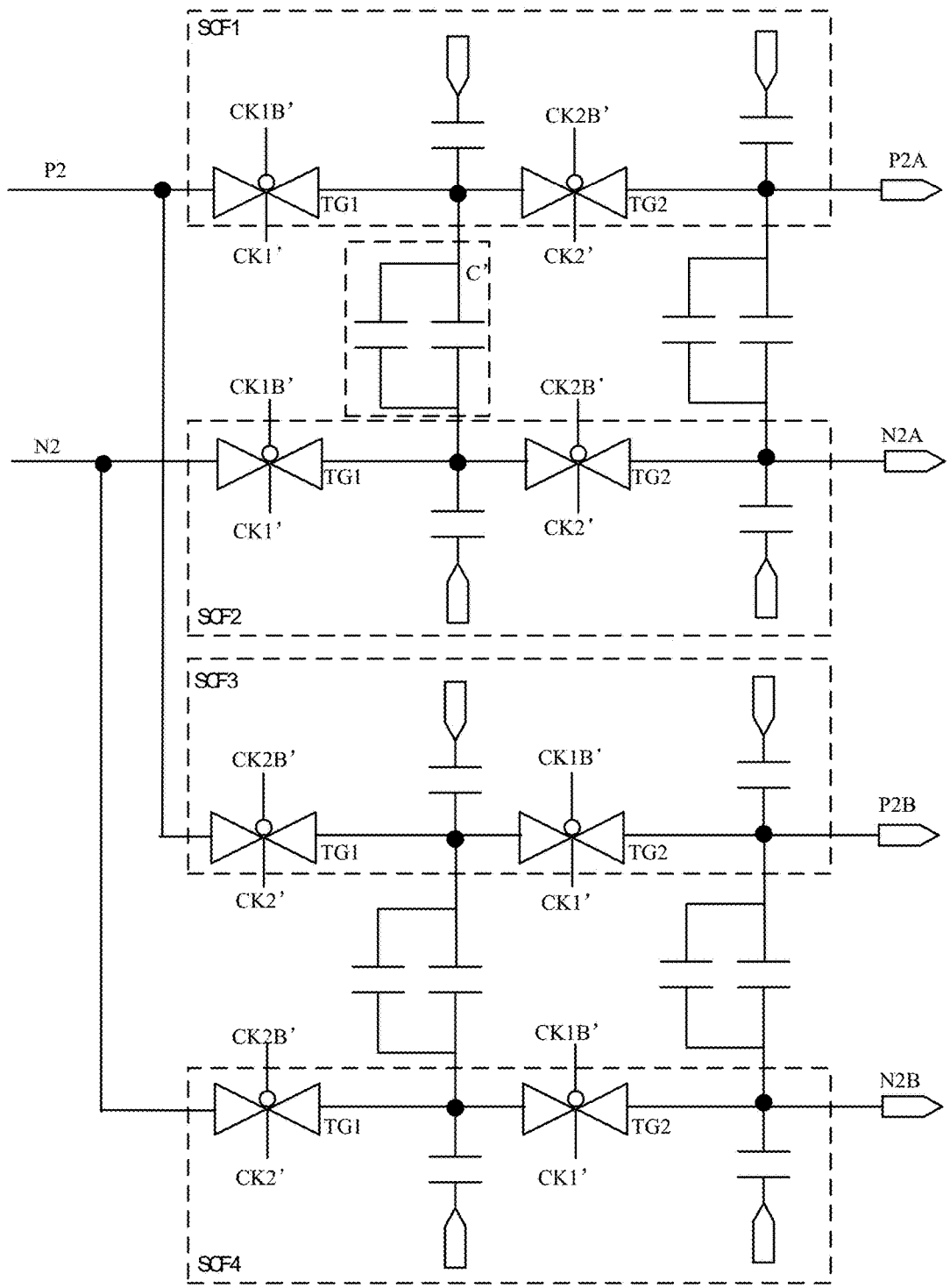
FIG. 8*a* is a schematic circuit diagram of the switched capacitor filter of FIG. 7.
Figure 8B:
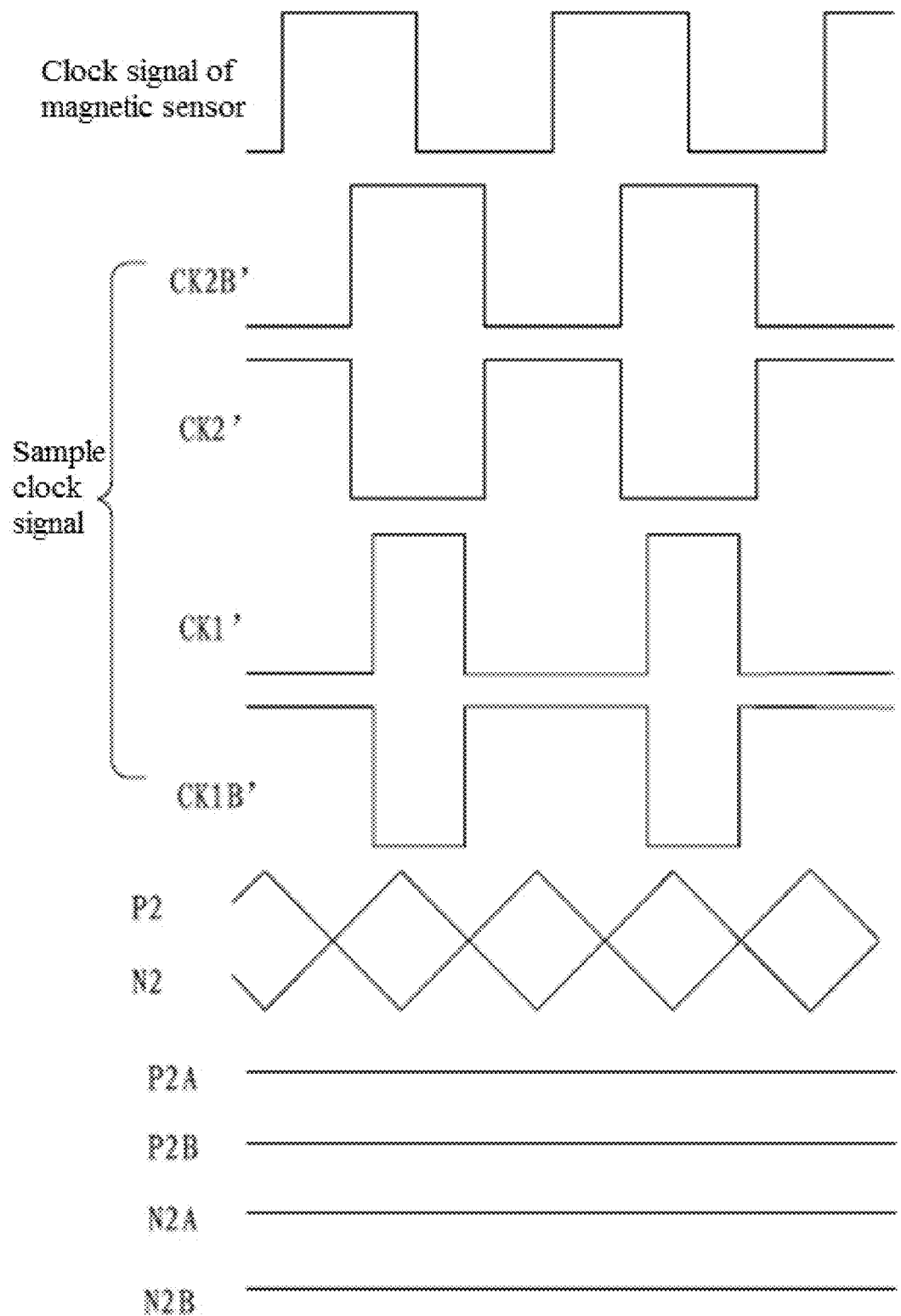
FIG. 8*b* is a time sequence diagram of the switched capacitor filter of FIG. 8*a*.

FIG. 8a shows a schematic circuit diagram of the switched capacitor filter, FIG. 8b shows a time sequence diagram of the switched capacitor filter of FIG. 8a. Each of the first switched capacitor filter SCF1, the second capacitor filter SCF2, the third capacitor filter SCF3, the fourth capacitor filter SCF4 can comprise two transmission gate switches and two capacitors (a dotted line frame as shown in FIG. 8a).

The first switched capacitor filter SCF1 and the second switched capacitor filter SCF2 are configured to sample the first sub differential signal and the second sub differential signal output by the chopping amplifier 123 in first half cycles thereof as a first sub sampled signal and a second sub sampled signal respectively. The third switched capacitor filter SCF3 and the fourth switch filter SCF4 can sample the first sub differential signal and the second sub differential signal output by the chopping amplifier 123 in second half cycles thereof as a third sub sampled signal and a fourth sub sampled signal respectively. As shown in FIG. 8a, a sample clock signal of the switched capacitor filter unit 124 can comprise four sub clock signals CK1', CK2', CK1B', and CK2B', each transmission gate switch is controlled by one sub clock signal.

When the differential signals P2 and N2 are received by the switched capacitor filter unit 124, a first transmission gate switches TG1 of the first switched capacitor filter SCF1 and the second switched capacitor filter SCF2 are turned on, a second transmission gate switches TG2 of the first switched capacitor SCF1 and the second switched capacitor filter SCF2 are turned off, a first transmission gate switches TG1 of the third switched capacitor filter SCF3 and the fourth switched capacitor filter SCF4 are turned off, and a second transmission gate switches TG2 of the third switched capacitor filter SCF3 and the fourth switched capacitor filter SCF4 are turned on, in first half cycles. In second half cycles, the first transmission gate switches TG1 of the first switched capacitor filter SCF1 and the second switched capacitor filter SCF2 are turned off, the second transmission gate switches TG2 of the first switched capacitor SCF1 and the second switched capacitor filter SCF2 are turned on, the first transmission gate switches TG1 of the third switched capacitor filter SCF3 and the fourth switched capacitor filter SCF4 are turned on, and the second transmission gate switches TG2 of the third switched capacitor filter SCF3 and the fourth switched capacitor filter SCF4 are turned off. The first and third switched capacitor filters sample first differential signal P2 in first and second half cycles, respectively; and the second and fourth switched capacitor filters sample second differential signal N2 in first and second half cycles, respectively.

As shown in FIG. 8a, a plurality of metal-insulator-metal (MIM) capacitors coupled between the first switched capacitor filter SCF1 and the second switched capacitor SCF2 in parallel. A plurality of metal-insulator-metal (MIM) capacitors coupled between the third switched capacitor filter SCF3 and the fourth switched capacitor filter SCF4. Two groups of capacitors are coupled between the first switched capacitor filter SCF1 and the second switched capacitor SCF2, each group of capacitor can comprise two capacitors coupled in parallel. One group of capacitor is electrically coupled between a common terminal of the two transmission gate switches of the first switched capacitor filter SCF1 and a common terminal of the two transmission gate switches of the second switched capacitor filter SCF2; and the other group of capacitor is electrically coupled between an output terminal of the second transmission gate switch TG2 of the first switched capacitor filter SCF1 and an output terminal of the second transmission gate switch TG2 of the second switched capacitor SCF2. Two groups of capacitors are coupled between the third switched capacitor filter SCF3 and the fourth switched capacitor SCF4, each group of capacitor can comprise two capacitors coupled in parallel. One group of capacitor is electrically coupled between a common terminal of the two transmission gate switches of the third switched capacitor filter SCF3 and a common terminal of the two transmission gate switches of the fourth switched capacitor filter SCF4; and the other group of capacitor is electrically coupled between an output terminal of the second transmission gate switch TG2 of the third switched capacitor filter SCF3 and an output terminal of the second transmission gate switch TG2 of the fourth switched capacitor SCF4.

A frequency of the sample clock signals is the same as a frequency of the clock signal of the magnetic sensor. The sample clock signals is delayed for the clock signal of the magnetic sensor with a predetermined time, such as, ¼ period of the clock signal of the magnetic sensor, a peak and a trough of the differential signals can be avoided.

The first switched capacitor filter SCF1 and the second switched capacitor SCF2 respectively sample the differential signals P2 and N2 in first half cycles thereof as a first sub sampled signal P2A and a second sub sampled signal N2A. The third switched capacitor filter SCF3 and the fourth switched capacitor filter SCF4 respectively sample the differential signals P2 and N2 in second half cycles thereof as a third sub sampled signal P2B and a fourth sub sampled signal N2B.

The offset is eliminated by adding the first sub sampled signal with the third sub sampled signal, and the offset is eliminated by adding the second sub sampled signal with the fourth sub sampled signal. As shown in FIG. 7, the switched capacitor filter unit further includes an adder 1241 configured to eliminate the offset by adding the first sampled signal with the second sampled signal to obtain a differential signal and amplify the differential signal. Specifically, the adder 1241 is configured to add the first sub sampled signal P2A with the third sub sampled signal P2B to eliminate the offset and add the second sub sampled signal N2A with the fourth sub sampled signal N2B to eliminate the offset, to obtain differential signals, and amplify the differential signals. Differential signals output by the adder 1241 are defined as P3 and N3. Optionally, the adder according to the embodiment of the present disclosure is a transconductance amplifier with a gain of 2.

Figure 8C:
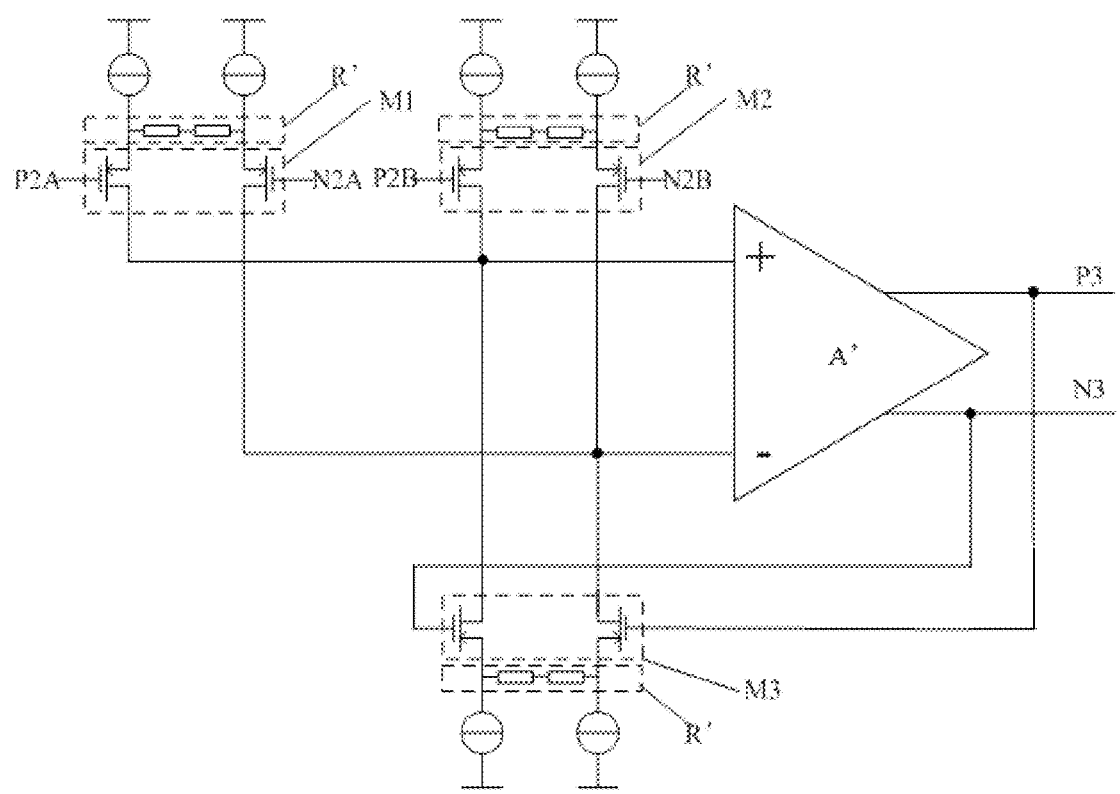
FIG. 8*c* is a schematic diagram of an adder according to one embodiment.
Figure 9:
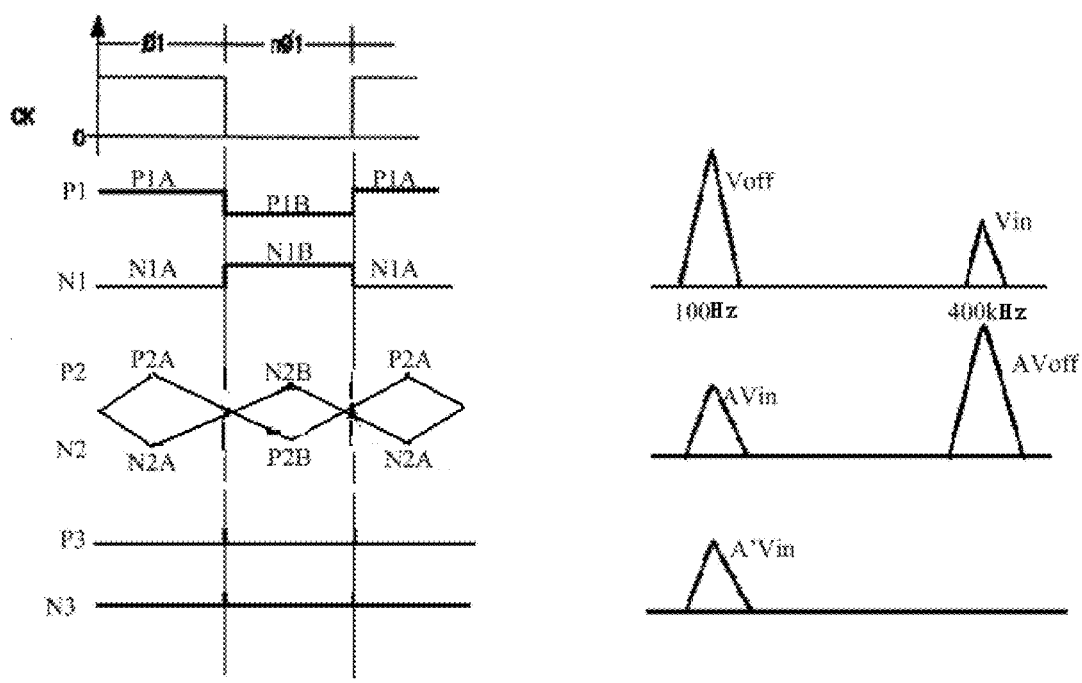
FIG. 9 is a schematic diagram of outputs of periodic clock signals according to one embodiment.

As shown in FIG. 8c which is a structural diagram of an adder according to an embodiment of the present disclosure, the adder includes an operational amplifier A', a first voltage-current converter M1, a second voltage-current converter M2 and a third voltage-current converter M3. Each of the voltage-current converters is electrically connected to a current source, and includes two metal oxide semiconductor (MOS) transistors. For the first voltage-current converter M1, a gate of a MOS transistor receives the sampled signal P2A, and an output end of the MOS transistor is electrically coupled to a non-inverting end of the operational amplifier A', a gate of the other MOS transistor is configured to receive the sampled signal N2A, and an output end of the other MOS transistor is electrically coupled to an inverting end of the operational amplifier A'. For the second voltage-current converter M2, a gate of a MOS transistor of is configured to receive the sampled signal P2B and an output end of the MOS transistor is electrically connected to the non-inverting end of the operational amplifier A', a gate of the other MOS transistor can receive the sampled signal N2B and an output end of the other MOS transistor is electrically connected to the inverting end of the operational amplifier A'. For the third voltage-current converter M3, a gate of a MOS transistor can receive the differential signal N3 output by the operational amplifier A', and an output end of the MOS transistor is electrically coupled to the non-inverting end of the operational amplifier A', a gate of the other MOS transistor can receive the differential signal P3 output by the operational amplifier A', and an output end of the MOS transistor is electrically connected to the inverting end of the operational amplifier A'. The voltage-current converters of the adder convert input sampled signals into currents, and eliminate offsets by adding the currents. The currents are output after being amplified by the operational amplifier of the adder. Preferably, a source degeneration resistor is arranged at the input end of the adder to ensure that the MOS transistor of the voltage-current converter operates in a saturation region. That is, as shown in FIG. 8c, a series resistor R' is electrically connected between source electrodes of two MOS transistors of the voltage-current converter, to ensure that the MOS transistors of the voltage-current converter operate in the saturation region.

Furthermore, the signal processing unit further includes a second amplifier unit 125, which is electrically connected between the switched capacitor filter unit 124 and the converter 130, and is configured to amplify the differential signal output by the adder. The second amplifier unit outputs amplified differential signals P3 and N3. In the embodiment, the second amplifier unit is a programmable gain amplifier with a gain of 5.

In the embodiment, the total amplification gain of the first amplifier unit, the adder and the second amplifier with respect to amplifying the magnetic field signal ranges from 800 to 2000 inclusively, and is preferably 1000. In other embodiments, the magnetic field signal may be amplified with a required gain by setting different gains for the first amplifier unit, the adder and the second amplifier unit.

As shown in FIG. 4, after processed by the switched capacitor filter unit and the second amplifier unit, the differential signal needs to be converted into a magnetic field signal by the signal processing unit 120, to control the output control circuit.

It can be seen from the above description that, the output signal Vout of the first chopping switch is a superposition of the offset signal Vos and the ideal magnetic field signal Vin, and equals to a difference between the differential signals P1 an N1. The differential signals P1 and N1 have the same magnitude and opposite directions. It can be seen from the above description that, for first and second half cycles of the clock signal CK1, ideal magnetic field voltage signals output by the first chopping switch have the same magnitude and opposite directions. As shown on the left portion of FIG. 9, the signal P1 is respectively represented as P1A and P1B in the first and second half cycles of clock signal, and the signal N1 is respectively represented as N1A and N1B in the first and second half cycles of clock signal. P1A, P1B, N1A and N1B are respectively represented as:

$$P1A=(Vos+Vin)/2; P1B=(Vos-Vin)/2$$

$N1A=-P1A=-(Vos+Vin)/2; N1B=-P1B=-(Vos-Vin)/2$

For easy understanding, the coefficient ½ of the differential signal is omitted in descriptions hereinafter. A pair of differential signals P1' and N1' are input into the second chopping switch via the first amplifier. The signal P1' is respectively represented as P1A' and P1B' in the first and second half cycles of clock signal, and the signal N1' is respectively represented as N1A' and N1B' in the first and second half cycles of clock signal. Due to a bandwidth limitation of the first amplifier A1, the differential signals output via the first amplifier A1 are triangular wave differential signals. The following formula is only a signal form. The signals are respectively represented as:

$P1A'=A(Voff+Vin)/2; P1B'=A(Voff-Vin)/2$ $N1A'=-P1A'=-A(Voff+Vin)/2; N1B'=-P1B'=-A(Voff-Vin)/2$ A is gain of the first amplifier, Voff is the offset of the output signal of the first amplifier which equals to a sum of an inherent offset Vos of the magnetic sensor 5 and the offset of the first amplifier. The offset Voff is variable due to the bandwidth limitation of the first amplifier A1. For easy understanding, a coefficient of the differential signal and an amplification coefficient of the amplifier are omitted in the descriptions hereinafter.

The second chopping switch Z2 is configured to directly output the pair of differential signals in a first half cycle of each clock cycle, and exchange the differential signals and output the exchanged differential signals in a second half cycle of each clock cycle. The differential signals output by the second chopping switch are represented as P2 and N2. The signal P2 is represented as P2A and P2B in first and second half cycles of clock signal, and the signal N2 is represented as N2A and N2B in first and second half cycles of clock signal. Outputs of the signals P2 and N2 are respectively represented as:

$P2A=P1A'=(Voff+Vin); P2B=N1B'=-(Voff-Vin)$ $N2A=N1A'=-(Voff+Vin); N2B=P1B'=(Voff-Vin);$ The four switched capacitor filters of the switched capacitor filter unit 124 sample each signal included in the differential signals P2 and N2 in first and second half cycles of each clock cycle respectively, and output two pairs of sampled signals. That is, a pair of sampled signals acquired by the switched capacitor filter unit includes P2A and P2B, and the other pair of sampled signals acquired by the switched capacitor filter unit includes N2A and N2B.

The four sampled signals are input into the adder, and the adder output P3 and N3. The adder adds two pairs of respective sampled signals of the two pairs and outputs P3 and N3, where $P3=P2A+P2B=(Voff+Vin)+(-(Voff-Vin))=2Vin;$ and $N3=N2A+N2B=-(Voff+Vin)+(Voff-Vin)=-2Vin.$ It can be seen that, the signals P3 and N3 output by the adder only include amplified ideal magnetic field voltage signals, and the offset signals are eliminated.

The magnetic field integrated circuit according to the embodiments of the present disclosure is described in conjunction with a specific application as follows.

Figure 10:
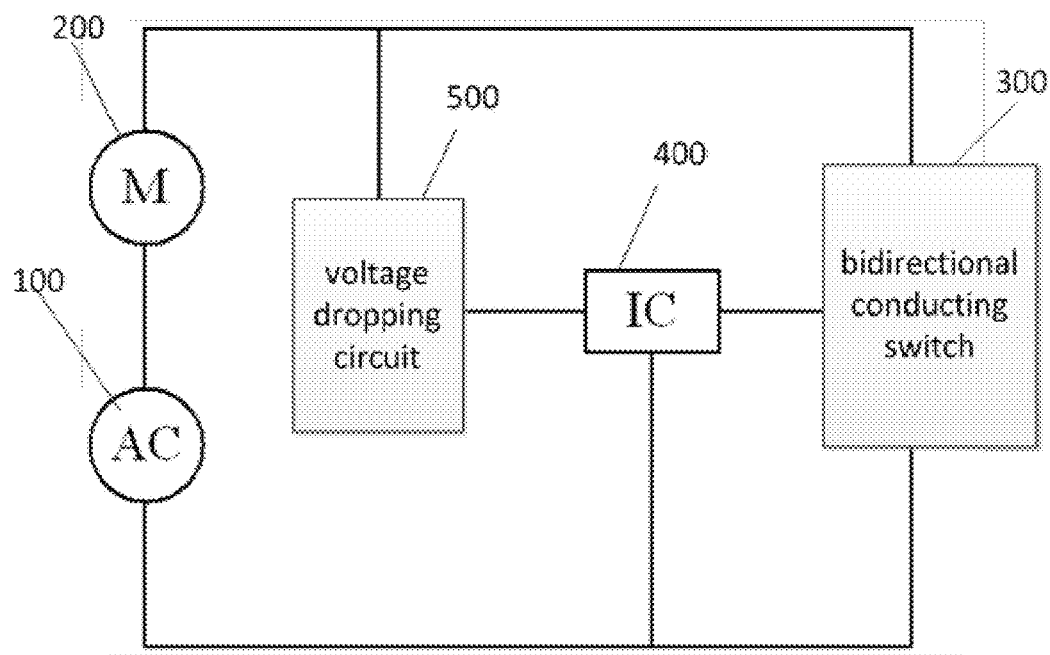
FIG. 10 is a schematic structural diagram of a circuit of a motor assembly according to one embodiment of the present disclosure.

As shown in FIG. 10, a motor assembly is further provided according to an embodiment of the present disclosure. The motor assembly includes an motor 200 powered by an alternating-current power 100, a bidirectional conducting switch 300 electrically connected to the motor 200 in series, and a magnetic sensor integrated circuit 400 according to any one of the above embodiments of the present disclosure. An output port of the magnetic sensor integrated circuit 400 is electrically connected to a control end of the bidirectional conducting switch 300. Preferably, the bidirectional conducting switch 300 may be a triode alternating current switch (TRIAC). It can be understood that, the bidirectional conducting switch may be implemented with other suitable types of switches. For example, the bidirectional conducting switch may include two silicon controlled rectifiers electrically connected in reverse parallel and a corresponding control circuit. The two silicon controlled rectifiers are controlled by the control circuit in a predetermined manner based on an output signal output by the output port of the magnetic sensor integrated circuit. Preferably, the motor further includes a voltage-dropping circuit 500 to drop the voltage of the alternating-current power 100 and provide the dropped voltage to the magnetic sensor integrated circuit 400. The magnetic sensor integrated circuit 400 is arranged in proximity to a rotor of the motor 200 to sense a change of a magnetic field of the rotor.

Figure 11:
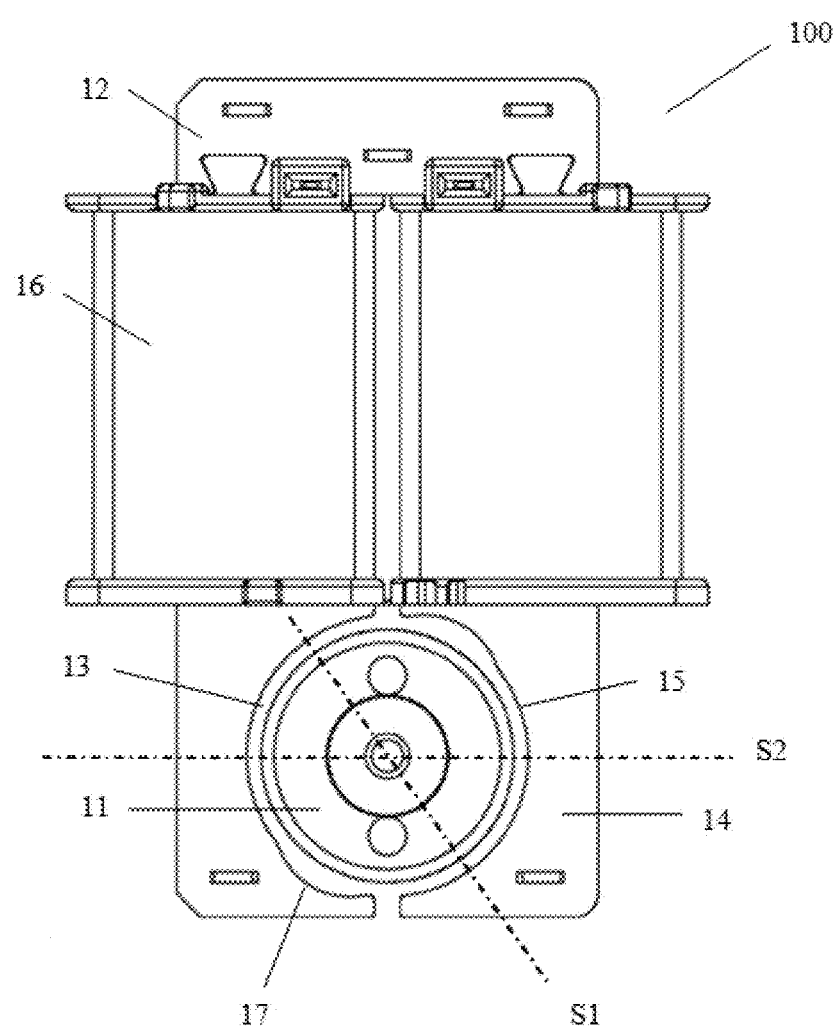
FIG. 11 is a schematic structural diagram of a synchronous motor according to one embodiment.

Based on the above embodiment, in an embodiment of the present disclosure, the motor is a synchronous motor. It can be understood that, the magnetic sensor integrated circuit according to the present disclosure is not only applied in the synchronous motor, but also applied in other types of permanent magnet motor such as direct-current brushless motor. As shown in FIG. 11, the synchronous motor includes a stator and a rotor 11 rotating with respect to the stator. The stator includes a stator core 12 and a stator winding 16 wound around the stator core 12. The stator core 12 may be made of soft magnetic material such as pure iron, cast iron, cast steel, electrical steel and silicon steel. The rotor 11 includes a permanent magnet. When the stator winding 16 is electrically connected to the alternating current power in series, the rotor 11 rotates with a constant speed of a constant rotation rate of (60 f/p) circle/minute in a steady state, where f is a frequency of the alternating-current power, and p is a number of pole-pairs of the rotor. In the embodiment, the stator core 12 has two pole portions 14 arranged oppositely. Each of the pole portions has a polar arc surface 15. An external surface of the rotor 11 faces the polar arc surface 15, and a substantially uniform air gap is formed therebetween. The basically uniform air gap in the present disclosure indicates that majority of the air gap between the stator and the rotor is uniform, and minority of the air gap between the stator and the rotor is non-uniform. Preferably, a concave starting groove 17 is arranged on the polar arc surface 15 of the pole portion of the stator. Portions other than the starting groove 17 on the polar arc surface 15 are concentric with the rotor. With the above configurations, a non-uniform magnetic field may be formed which ensures that when the rotor does not rotate, a polar axis S1 of the rotor is tilted with an angle with respect to a central axis S2 of the pole portion of the stator, so that the rotor can have a starting torque each time when the motor is powered on under an effect of the integration circuit. The polar axis S1 of the rotor is a boundary between two magnetic poles of the rotor with different polarities. The central axis S2 of the pole portion 14 of the stator is a connection line passing through centers of the two pole portions 14 of the stator. In the embodiment, the stator and the rotor each have two magnetic poles. It can be understood that, in other embodiments, the number of magnetic poles of the stator may be different from the number of magnetic poles of the rotor, and the stator and the rotor may have more magnetic poles such as four magnetic poles and six magnetic poles.

Preferably, the output control circuit 30 is configured to switch on the bidirectional conducting switch 300, when the alternating-current power 100 operates in a positive half cycle and the magnetic sensor detects that a magnetic field of the permanent magnet rotor has a first polarity, or when the alternating-current power 100 operates in a negative half cycle and the magnetic sensor detects that the magnetic field of the permanent magnet rotor has a second polarity opposite to the first polarity. The output control circuit 30 switches off the bidirectional conducting switch 300, when the alternating-current power 100 operates in the negative half cycle and the permanent magnet rotor has the first polarity, or when the alternating-current power 100 operates in the positive half cycle and the permanent magnet rotor has the second polarity.

Based on the above embodiment, in an embodiment of the present disclosure, the output control circuit 30 is configured to control a drive current to flow between the output port and the bidirectional conducting switch 300, thereby switching on the bidirectional conducting switch 300, when the alternating-current power 100 operates in the positive half cycle and the magnetic sensor 5 detects that the magnetic field of the permanent magnet rotor with the first polarity, or when the alternating-current power 100 operates in the negative half cycle and the magnetic sensor (which includes a magnetic sensor and a signal processing unit electrically connected thereto) detects that the magnetic field of the permanent magnet rotor with the second polarity opposite to the first polarity; and to prevent a driven current flows between the output port and the bidirectional conducing switch 300, when the alternating-current power 100 operates in the negative half cycle and the permanent magnet rotor has the first polarity, or when the alternating-current power 100 operates in the positive half cycle and the permanent magnet rotor has the second polarity.

Preferably, the output control circuit 30 is configured to control a current to flow from the integrated circuit to the bidirectional conducting switch 300, when the signal output by the alternating-current power 100 is in the positive half cycle and the magnetic sensor detects that the magnetic field of the permanent magnet rotor with the first polarity; and control a current to flow from the bidirectional conducting switch 300 to the integrated circuit, when the signal output by the alternating-current power 100 is in the negative half cycle and the magnetic sensor detects that the magnetic field of the permanent magnet rotor with the second polarity opposite to the first polarity. It can be understood that, when the permanent magnet rotor has the first magnetic polarity and the alternating-current power is in the positive half cycle, the current may flow out of the integrated circuit for the entire or a portion of the positive half cycle; and when the permanent magnet rotor with the second magnetic polarity and the alternating-current power is in the negative half cycle, the current may be flowing into of the integrated circuit for the entire or a portion of the negative half cycles.

In the embodiment of the present disclosure, the magnetic field detection signal is a switch-type detection signal. In a steady stage of the motor, a switching frequency of the switch-type detection signal is twice the frequency of the alternating-current power.

It can be understood that, in the above embodiments, the magnetic sensor integrated circuit according to the present disclosure is described only in conjunction with a possible application, and the magnetic sensor according to the present disclosure is not limited thereto. For example, the magnetic sensor is not only applied in an motor driving, but can also be applied in other applications with magnetic field detection.

In a motor according to another embodiment of the present disclosure, the motor may be electrically connected to a bidirectional conducting switch in series between two ends of an external alternating-current power. A first series branch formed by the motor and the bidirectional conducting switch is parallel-electrically connected to a second series branch formed by a voltage-decreasing circuit and a magnetic sensor integrated circuit. An output port of the magnetic sensor integrated circuit is electrically connected to the bidirectional conducting switch, to control the bidirectional conducting switch to switch on and switch off in a predetermined manner, thereby controlling a way of powering the stator winding.

Accordingly, an application apparatus is further provided according to an embodiment of the present disclosure. The application apparatus includes a motor powered by an alternating-current power, a bidirectional conducting switch electrically connected to the motor in series, and the magnetic sensor integrated circuit according to any one of the above embodiments. An output port of the magnetic sensor integrated circuit is electrically connected to a control end of the bidirectional conducting switch. Optionally, the application apparatus may be a pump, a fan, a household appliance, a vehicle and the like, where the household appliance, for example, may be a washing machine, a dishwasher, a range hood, an exhaust fan and the like.

With the above descriptions of the disclosed embodiments, those skilled in the art may achieve or use the present disclosure. Various modifications to the embodiments are apparent for those skilled in the art. The general principle defined herein may be implemented in other embodiments without departing from the spirit or scope of the disclosure. Therefore, the present disclosure is not limited to the embodiments disclosed herein, but confirm to the widest scope in consistent with the principle and the novel features disclosed herein.

The invention claimed is:

1. A magnetic sensor integrated circuit, comprising:
   an input port electrically coupled to an external power source;
   a magnetic sensor sensing a polarity of an external magnetic field and outputting a detection signal; and
   a signal processing unit having a switched capacitor filter unit to sample and filter the detection signal and eliminate an offset of the detection signal,
   wherein the detection signal comprises a magnetic field signal and an offset signal; the signal processing unit comprises a first chopping switch to modulate the magnetic field signal to a high frequency region and the offset signal to a baseband frequency, the signal processing unit further comprises a chopping amplifier to amplify the magnetic field signal and the offset signal and demodulate the magnetic field signal to the baseband frequency,
   wherein the switched capacitor filter unit comprises: a first switched capacitor filter, a second switched capacitor filter, a third switch capacitor filter and a fourth switched capacitor filter, and
   wherein the first switched capacitor filter and the second switched capacitor filter sample a differential signal output by the chopping amplifier unit in a first half cycle as a first sub sampled signal and a second sub sampled signal, and the third switched capacitor filter and the fourth switched capacitor filter sample the differential signal output by the chopping amplifier unit in a second half cycle as a third sub sampled signal and a fourth sub sampled signal.

2. The magnetic sensor integrated circuit according to claim 1, wherein a sample clock signal of the switched capacitor filter unit is delayed for a clock signal of the magnetic sensor with a predetermined time.

3. The magnetic sensor integrated circuit according to claim 2, wherein the predetermined time is ¼ period of the clock signal of the magnetic sensor.

4. The magnetic sensor integrated circuit according to claim 1, further comprising:
 a plurality of metal-insulator-metal capacitors coupled between the first switched capacitor filter and the second switched capacitor filter in parallel; and
 a plurality of metal-insulator-metal capacitors coupled between the third switched capacitor and the fourth switched capacitor filter in parallel.

5. The magnetic sensor integrated circuit according to claim 1, wherein the switched capacitor filter unit further comprises an adder to eliminate the offset to obtain a differential signal and amplify the differential signal.

6. The magnetic sensor integrated circuit according to claim 5, wherein a source degeneration resistor is arranged at an input end of the adder.

7. The magnetic sensor integrated circuit according to claim 5, wherein the adder is a transconductance amplifier with a gain of 2.

8. The magnetic sensor integrated circuit according to claim 1, wherein the adder is configured to add the first sub sampled signal with the third sub sampled signal and add the second sub sampled signal with the fourth sub sampled signal.

9. The magnetic sensor integrated circuit according to claim 1, further comprising a rectifier to convert an alternating-current power of the external power source into a direct-current power to supply the signal processing unit.

10. The magnetic sensor integrated circuit according to claim 1, wherein a sample frequency of the switched capacitor filter unit is the same with a chopping frequency of the first chopping switch.

11. The magnetic sensor integrated circuit according to claim 3, wherein a gain of the chopping amplifier is 100.

12. A motor assembly, comprising a motor powered by an alternating-current power and the magnetic sensor integrated circuit according to claim 1.

13. An application apparatus comprising a motor assembly, wherein the motor assembly comprises a motor powered by an alternating-current power and the magnetic sensor integrated circuit according to claim 1.

14. The application apparatus according to claim 13, comprising a pump, a fan, a household appliance or a vehicle.

* * * * *